(12) United States Patent
Balluchi et al.

(10) Patent No.: US 8,824,235 B2
(45) Date of Patent: Sep. 2, 2014

(54) CONTROLLING CLOCK INPUT BUFFERS

(75) Inventors: Daniele Balluchi, Vimercate (IT);
Daniele Vimercati, Milan (IT);
Graziano Mirichigni, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/519,846

(22) PCT Filed: Dec. 30, 2009

(86) PCT No.: PCT/IT2009/000592
§ 371 (c)(1),
(2), (4) Date: Aug. 24, 2012

(87) PCT Pub. No.: WO2011/080773
PCT Pub. Date: Jul. 7, 2011

(65) Prior Publication Data
US 2012/0314522 A1    Dec. 13, 2012

(51) Int. Cl.
*G11C 5/14* (2006.01)
(52) U.S. Cl.
USPC ............................................... 365/227
(58) Field of Classification Search
USPC ............................................... 365/227
See application file for complete search history.

(56) References Cited

U.S. PATENT DOCUMENTS

| | | | |
|---|---|---|---|
| 6,101,144 A | 8/2000 | Jo | |
| 6,266,294 B1 | 7/2001 | Yada et al. | |
| 6,697,296 B2 | 2/2004 | Matsumoto et al. | |
| 7,522,469 B2 | 4/2009 | Lee | |
| 7,616,037 B2 | 11/2009 | Cho | |
| 2001/0043099 A1 | 11/2001 | Kawasaki et al. | |
| 2002/0191480 A1 | 12/2002 | Matsumoto et al. | |
| 2003/0142771 A1* | 7/2003 | Kuhlmann et al. | 375/358 |
| 2006/0034394 A1* | 2/2006 | Popescu et al. | 375/326 |
| 2007/0070782 A1* | 3/2007 | Lee et al. | 365/230.06 |
| 2009/0051391 A1* | 2/2009 | Kwon | 327/68 |
| 2009/0121747 A1* | 5/2009 | Dhong et al. | 327/36 |

FOREIGN PATENT DOCUMENTS

| | | |
|---|---|---|
| JP | 08-315572 | 11/1996 |
| JP | 11-317076 | 11/1999 |

OTHER PUBLICATIONS

Communication Under Rule 161(1) EPC dated Sep. 14, 2012 received for EP09807651.6.
Notice of Preliminary Rejection for KR Appl No. 10-2012-7019690.
"International Search Report for PCT/IT2009/000592", PCT International Search Report, May 3, 2010.
JP Notice of Rejection Grounds for Appl No. 2012-546561 mailed Sep. 10, 2013.
First Office Action for Appl No. CN200980163478.3, Issue 01127/14.
Examination Report (Communication pursuant to Article 94(3) EPC) Mailed Feb. 18, 2014.
Notice of Last Preliminary Rejection dated Jun. 25, 2014 for KR Appl No. 10-2012-7019690.

* cited by examiner

*Primary Examiner* — Anthan Tran
(74) *Attorney, Agent, or Firm* — Dorsey & Whitney LLP

(57) ABSTRACT

An integrated circuit may have a clock input pin coupled to a buffer (24). The buffer may supply a clock signal (28) to an integrated circuit chip such as the memory. To conserve power, the buffer is powered down. When ready for use, the buffer is quickly powered back up. In one embodiment, in response to a predetermined number of toggles of the clock signal, the buffer is automatically powered up.

16 Claims, 4 Drawing Sheets

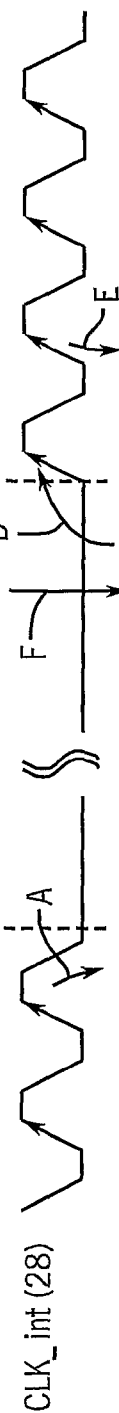
FIG. 3 CKE
FIG. 4 CLK/CLK#
FIG. 5 CLK_int (28)
FIG. 6 INPUT_ENABLE (36)
FIG. 7 CLK_EN_RST (37)
FIG. 8 CLK_EN_SET (33)
FIG. 9 CLK_BUFF_ENABLE (38)

CONTROLLING CLOCK INPUT BUFFERS

TECHNICAL FIELD

This relates generally to clock input buffers.

BACKGROUND

Typically, clock input buffers are used to control inputs to a variety of circuits. For example, in connection with a low power double data rate 2 (LPDDR2) synchronous dynamic random access memory (LPDDR2-S (SDRAM)) or non-volatile memory (LPDDR2-N), the input buffers of all signals, except the clock, can be disabled using a clock enable (CKE) input signal. The clock input buffer consumes power, even when the clock is stable, because the clock input buffer is implemented with a differential amplifier.

BRIEF DESCRIPTION OF THE DRAWINGS

FIG. 3 is a timing diagram for the clock enable signal in accordance with one embodiment;
FIG. 4 is a timing diagram for the clock and clock inverse signals in accordance with one embodiment;
FIG. 5 is a timing diagram for the CLK_int signal in accordance with one embodiment;
FIG. 6 is a timing diagram for the INPUT_ENABLE signal in accordance with one embodiment;
FIG. 7 is a timing diagram for the signal CLK_EN_RST in accordance with one embodiment;
FIG. 8 is a timing diagram for the CLK_EN_SET signal in accordance with one embodiment;
FIG. 9 is a timing diagram for the CLK_BUFF_ENABLE signal in accordance with one embodiment.

DETAILED DESCRIPTION

Figure 1:
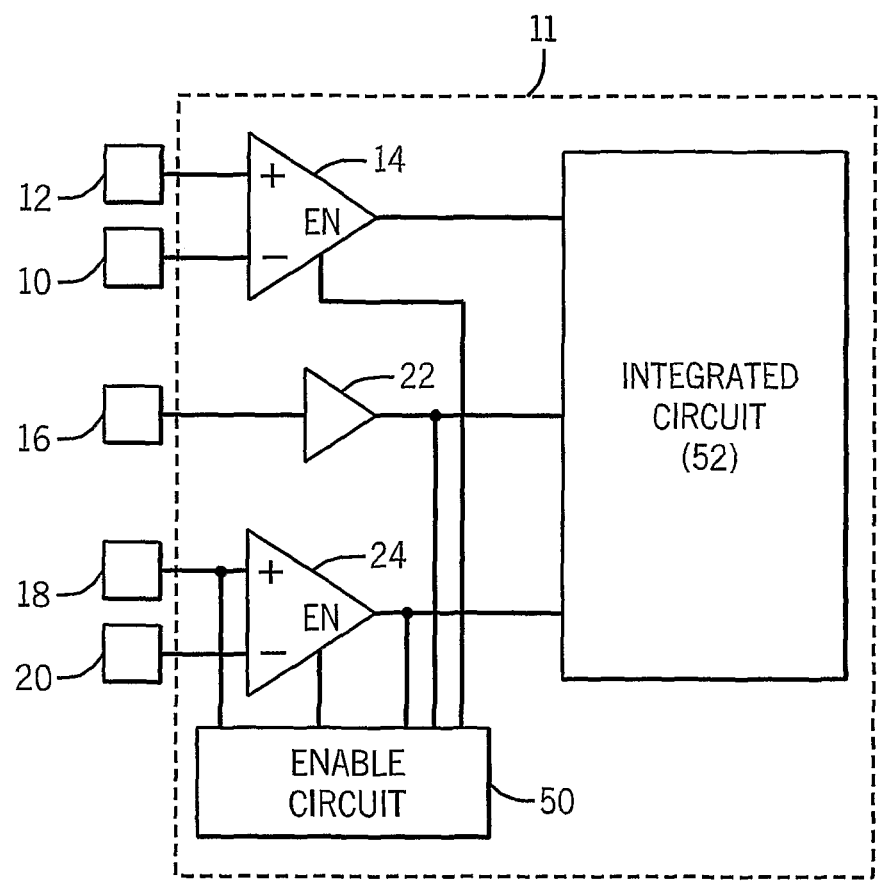
FIG. 1 is a circuit schematic for one embodiment.

Referring to FIG. 1, an integrated circuit package 11 may include contacts 10, 12, 16, 18, and 20. Integrated circuit package 11 may enclose an integrated circuit 52 coupled to buffers 14, 22, and 24. The buffers buffer input signals from contacts 10, 12, 16, 18, and 20. An enable circuit 50 may control power consumption of buffers 14 and 24 to disable them to reduce power consumption and then to quickly enable them for integrated circuit operations.

In some embodiments, enable circuit 50 powers down the buffer 24 in particular to reduce its power consumption by providing an enable signal to the EN input of that buffer. Then when it is desired to operate the integrated circuit 52, the buffer 24 can be enabled quickly, in some embodiments. For example, in some embodiments, in response to a given number of toggles of a clock signal, buffer 24 may be quickly enabled. This is particularly advantageous in connection with low power double data rate 2 memories, for example.

Contacts 10, 12, 16, 18, and 20 may be on the outside of an integrated circuit package 11 and circuit 52 may be an integrated circuit chip within package 11. It may, for example, be a memory circuit and, as one example, the chip 52 may be a low power double data rate 2 memory.

Input buffers 14 (only one shown in FIG. 1) may be coupled to contacts 10 and 12. Contact 10 may be associated with the input signal Vref or reference voltage and contacts 12 may be for other inputs. Thus, contacts 10 and 12 may be associated with various connectors on the outside of an integrated circuit package. These connectors may be lands, pins, solder balls, sockets, or any of a variety of electrical connectors used in integrated circuit packaging. In addition, there may be a contact 16 for the clock enable signal, a contact 18 for the clock signal, and a contact 20 for the clock inverse signal.

Figure 2:
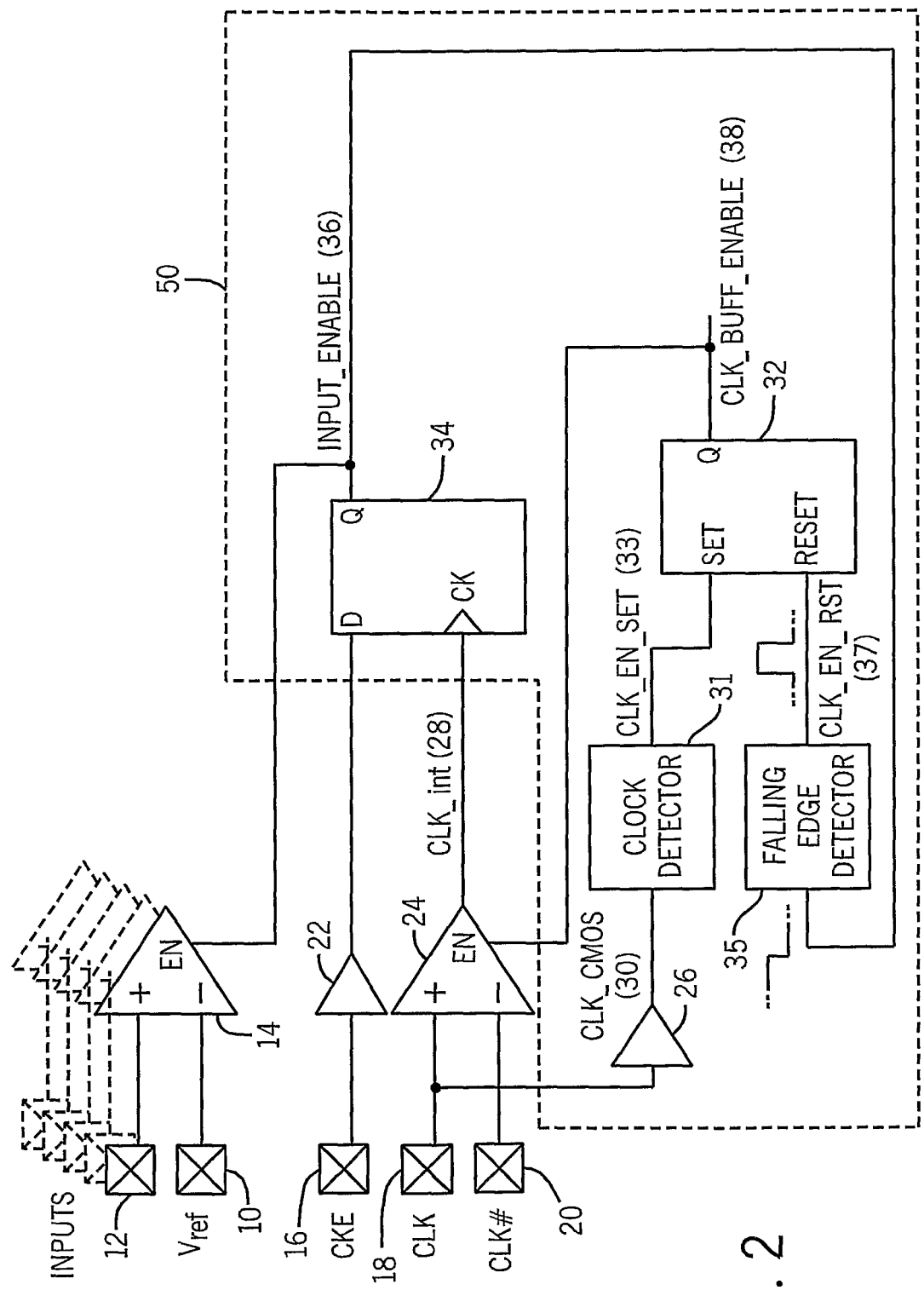
FIG. 2 is a more detailed circuit schematic for one embodiment of the present invention.

Referring to FIG. 2, clock enable signal from contact 16 goes to a buffer 22 that is, in turn, coupled to the enable circuit 50, and, particularly, a DQ flipflop 34 in one embodiment. DQ flipflop 34 has a clock input CK, an input D, and an output Q in one embodiment. DQ flipflop 34 may be edge triggered and, in one embodiment, may be positive edge triggered. On the rising edge of the clock (CK), the input D may be sampled and transferred to the output Q. At other times, the input D may be ignored.

Clock contact 18 may be coupled to a buffer 24, that outputs a signal CLK_int 28, which is the clock (CK) input to DQ flipflop 34. The negative input to buffer 24 is from clock inverse contact 20.

The clock signal from the contact 18 may also go through a low power consumption complementary metal oxide semiconductor (CMOS) buffer 26 to create CLK_CMOS signal 30, which becomes the clock input to the clock detector 31 in one embodiment. The clock detector output (CLK_EN_SET) 33 may be provided to the set terminal of an SR latch 32. The reset terminal may be coupled to the CLK_EN_RST signal 37 from the output of a falling edge detector 35. The falling edge detector 35 detects the falling edge of the INPUT_ENABLE signal 36 from the DQ flipflop 34, in one embodiment.

The Q output of SR latch 32 is the signal CLK_BUFF_ENABLE 38, provided to the enable input of the buffer 24 in one embodiment. SR latch 32 output Q may be low when set is pulsed low and reset is high and may be high when set is high and reset is low. Buffer 24 may be enabled when signal 38 from output Q of SR latch 32 is high. When signal 38 is low, buffer 24 may be disabled, resulting in power savings.

Clock input buffer 24 may consume power even when the clock CLK is stable, for example, when buffer 24 is implemented with a differential amplifier. Clock differential input buffer 24 may be disabled during power down of clock enable signal to reduce the current consumption. In fact, current consumption may be in the range of standby current in some embodiments. The time needed to enable the clock input buffer 24 at power down exit may be material, in some embodiments, because the clock input is used to latch the command/address bus in a LPDDR2 memory, for example.

In the case where circuit 52 is an LPDDR2 memory, the clock may toggle two times before raising the clock enable signal to exit power down in one embodiment. Clock detector 31 may detect clock toggling with dedicated circuitry to enable, in advance, the clock differential input buffer.

Clock differential input buffer 24 may be disabled when integrated circuit 52 enters the power down mode and may be enabled when the clock starts to toggle again. Detector 31 may detect clock toggling (e.g. one or two toggles) and may enable clock differential input buffer 24.

Thus, referring to FIG. 3, the clock enable (CKE) signal, in this example, may fall during a period of high power consumption to transition to a powered down, lower power consumption mode. The clock (CLK) signal is shown in solid lines and the clock inverse (CLK#) signal is shown in dashed lines in FIG. 4. The CLK_int signal 28 is the buffered clock signal, as shown in FIG. 5.

The falling of the clock enable signal (FIG. 3) followed by a rising edge of the CLK-int signal 28 (FIG. 5) may trigger, as indicated by the arrow A, the INPUT_ENABLE signal 36, shown in FIG. 6. As a result, that signal 36 may fall after a delay from the drop in the clock enable signal. The falling edge of the INPUT_ENABLE signal 36 triggers the falling edge detector 35 (FIG. 2), as indicated by the arrow B, to issue the CLK_EN_RST signal 37, shown in FIG. 7. The signal 37 triggers the SR latch to issue the CLK_BUFF_ENABLE signal 38, as indicated by arrow C. The falling signal 38 powers down the buffer 24 in one embodiment. The INPUT_ENABLE signal 36 may enable or disable the buffers 14 in FIG. 2.

Thus, power consumption transitions from high power consumption, due to consumption of power in input buffers, including the buffer 24, and enters a lower power consumption state where all the input buffers, including the buffer 24, are powered down.

When the CLK signal (FIG. 4) undergoes a couple of cycles, in one embodiment, the clock detector 31 responds, as indicated by arrow F, causing the set input to the latch 32 to invert so that its output signal 38 goes high (FIG. 9), as indicated by the arrow G. This enables the buffer 24, as indicated by the arrow D and the CLK_int signal 28.

At the first CLK_int rising edge with rising clock enable, the output INPUT_ENABLE signal 36 (FIG. 6) switches to high, as indicated by the arrow E. Thus, the clock input buffer 24 may be powered down to save power consumption and can be powered back up in response to toggling of the clock (CLK) signal.

In the embodiments described herein, the clock signal (FIG. 4) rising edge (after a period of inactivity of the clock) generates a pulse of CLK_EN_SET signal 33 (FIG. 7). The output of the clock detector 31 sets the CLK_BUFF_ENABLE signal 38 (FIGS. 9) and enables the CLK/CLK# differential buffer 24.

Figure 10:
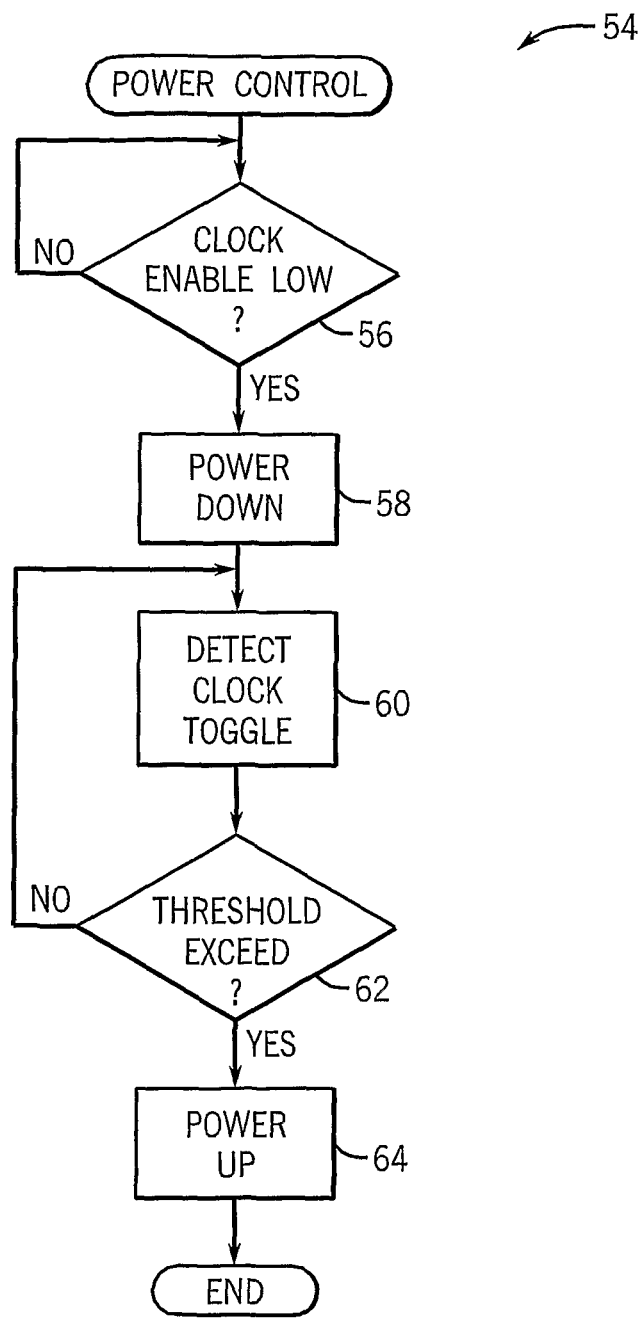
FIG. 10 is a flow chart for one embodiment.

Referring to FIG. 10, the power control sequence 54 may be implemented in software, hardware, or firmware. In a software embodiment, it may be implemented by instructions stored within a computer readable medium such as a semiconductor, optical, or magnetic memory. The instructions are executed by a processor or controller. For example, the instructions may be stored within a storage within the enable circuit 50 and executed by an enable circuit processor in accordance with one embodiment.

Initially, a check at diamond 56 determines whether a clock enable signal has gone low. If so, a power down or power reduction is implemented, as indicated in block 58. Then, at block 60, when the clock signal starts up again, the clock signal is detected. This detection may include counting the number of clock toggles. When detected (or, for example, with a threshold number of toggles is exceeded), as determined in diamond 62, then the circuit is powered up, as indicated in block 64.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method comprising:
controlling power consumption of a buffer based on the detection of toggling of a clock signal; and
generating, with a latch, a signal to power down said buffer responsive to the latch receiving a reset signal provided by a flipflop.

2. The method of claim 1 including powering down said buffer in response to a power down state.

3. The method of claim 1 wherein said latch is an SR latch and providing a signal to said SR latch when the number of toggles of said clock signal exceeds a threshold.

4. The method of claim 3 including outputting a signal from said SR latch to power up said buffer.

5. The method of claim 1 including counting a predetermined number of toggles of said clock signal to power up said buffer to a higher power consumption mode.

6. The method of claim 1 including using said buffer to provide a clock signal to an integrated circuit chip.

7. The method of claim 6 including using said buffer to supply a clock signal to a low power double data rate 2 memory.

8. An integrated circuit comprising:
an integrated circuit chip;
a buffer to supply a clock signal to said integrated circuit chip; and
a device to increase the power consumption of said buffer in response to detection of cycling of said clock signal, the device comprising:
a detector to count a number of cycles of said clock signal; and
a latch coupled to said detector and configured to generate an output signal when said number of cycles of said clock signal reaches a threshold and further configured to supply said output signal to said buffer to enable said buffer to transition to an increase power consumption mode.

9. The circuit of claim 8 wherein said circuit is a memory.

10. The circuit of claim 9 wherein said circuit is a low power double data rate 2 memory.

11. The circuit of claim 8 further including a latch coupled to the output of said buffer and having an output coupled to said flipflop to reset said flipflop.

12. A memory comprising:
a memory integrated circuit chip;
a buffer coupled to said chip, said buffer configured to receive a first clock signal and to supply a second clock signal to said chip;
and a circuit to control power consumption of said buffer in response to toggling of said first clock signal, said circuit comprising;
a detector configured to receive said first clock signal and further configured to provide a set signal in response to a number of cycles of said first clock signal reaching a threshold; and
a latch configured to receive said set signal and further configured to enable said buffer in response to said set signal.

13. The memory of claim 12 wherein said memory is a low power double data rate 2 memory.

14. The memory of claim 12 wherein said threshold is two clock cycles.

15. The memory of claim 12 including a DQ flipflop coupled to the output of said buffer.

16. The memory of claim 15 wherein said latch is an SR latch coupled to said detector and having a reset pin coupled to the output of said DQ flipflop.

* * * * *

UNITED STATES PATENT AND TRADEMARK OFFICE
CERTIFICATE OF CORRECTION

| | | |
|---|---|---|
| PATENT NO. | : 8,824,235 B2 | Page 1 of 1 |
| APPLICATION NO. | : 13/519846 | |
| DATED | : September 2, 2014 | |
| INVENTOR(S) | : Daniele Balluchi et al. | |

It is certified that error appears in the above-identified patent and that said Letters Patent is hereby corrected as shown below:

On the title page, item (56), under "Other Publications", in column 2, lines 8-9, delete "01127/14." and insert -- 01/27/14. --, therefor.

In the Specification

Column 4, line 54, in Claim 12, delete "comprising;" and insert -- comprising: --, therefor.

Signed and Sealed this
Eighteenth Day of November, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,824,235 B2  
APPLICATION NO. : 13/519846  
DATED : September 2, 2014  
INVENTOR(S) : Daniele Balluchi et al.

Page 1 of 1

It is certified that error appears in the above-identified patent and that said Letters Patent is hereby corrected as shown below:

On the title page, item (56), under "Other Publications", in column 2, lines 8-9, delete "01127/14." and insert -- 01/27/14. --, therefor.

In the Claims

Column 4, line 54, in Claim 12, delete "comprising;" and insert -- comprising: --, therefor.

This certificate supersedes the Certificate of Correction issued November 18, 2014.

Signed and Sealed this  
Sixteenth Day of December, 2014

Michelle K. Lee  
*Deputy Director of the United States Patent and Trademark Office*